(12) United States Patent
Jiang et al.

(10) Patent No.: US 7,282,436 B2
(45) Date of Patent: Oct. 16, 2007

(54) PLASMA TREATMENT FOR SILICON-BASED DIELECTRICS

(75) Inventors: Ping Jiang, Plano, TX (US); Hyesook Hong, Allen, TX (US); Ting Yiu Tsui, Garland, TX (US); Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 261 days.

(21) Appl. No.: 10/843,957

(22) Filed: May 11, 2004

(65) Prior Publication Data

US 2005/0255687 A1 Nov. 17, 2005

(51) Int. Cl.
*H01L 21/4763* (2006.01)

(52) U.S. Cl. ............. 438/622; 438/624; 438/778; 438/782; 257/E21.002

(58) Field of Classification Search ........... 438/622, 438/624, 778, 782
See application file for complete search history.

(56) References Cited

U.S. PATENT DOCUMENTS

| | | | |
|---|---|---|---|
| 6,251,804 B1 * | 6/2001 | Chen ................. | 438/778 |
| 6,348,407 B1 * | 2/2002 | Gupta et al. .......... | 438/637 |
| 6,559,070 B1 * | 5/2003 | Mandal ............... | 438/781 |
| 6,911,346 B2 * | 6/2005 | Ying et al. ............ | 438/3 |
| 6,943,431 B2 * | 9/2005 | Fukuyama et al. ..... | 257/637 |
| 2001/0012601 A1 | 8/2001 | Fujii et al. | |
| 2005/0014362 A1 * | 1/2005 | Ho et al. ............. | 438/637 |
| 2005/0095840 A1 * | 5/2005 | Bhanap et al. ........ | 438/623 |

* cited by examiner

*Primary Examiner*—Zandra V. Smith
*Assistant Examiner*—Christy L Novacek
(74) *Attorney, Agent, or Firm*—Rose Alyssa Keagy; W. James Brady; Frederick J. Telecky, Jr.

(57) ABSTRACT

An embodiment of the invention is a method of manufacturing a semiconductor wafer. The method includes depositing spin-on-glass material over the semiconductor wafer (step 208), modifying a top surface of the spin-on glass material to form a $SiO_2$ layer (step 210), applying a vapor prime (step 212), forming a photoresist layer over the spin-on-glass material (step 214), patterning the photoresist layer (step 214), and then etching the semiconductor wafer (step 216). Another embodiment of the invention is a method of manufacturing a dual damascene back-end layer on a semiconductor wafer. The method includes depositing spin-on-glass material over the dielectric layer and within the via holes (step 208), modifying a top surface of the spin-on glass material to form a $SiO_2$ layer (step 210), applying a vapor prime (step 212), forming a photoresist layer over said spin-on-glass material (step 214), patterning the photoresist layer (step 214), and etching trench spaces (step 216).

52 Claims, 12 Drawing Sheets

PLASMA TREATMENT FOR SILICON-BASED DIELECTRICS

BACKGROUND OF THE INVENTION

This invention relates to a plasma treatment of silicon-based dielectric material during the fabrication of semiconductor wafers.

DETAILED DESCRIPTION OF THE INVENTION

Figure 1:
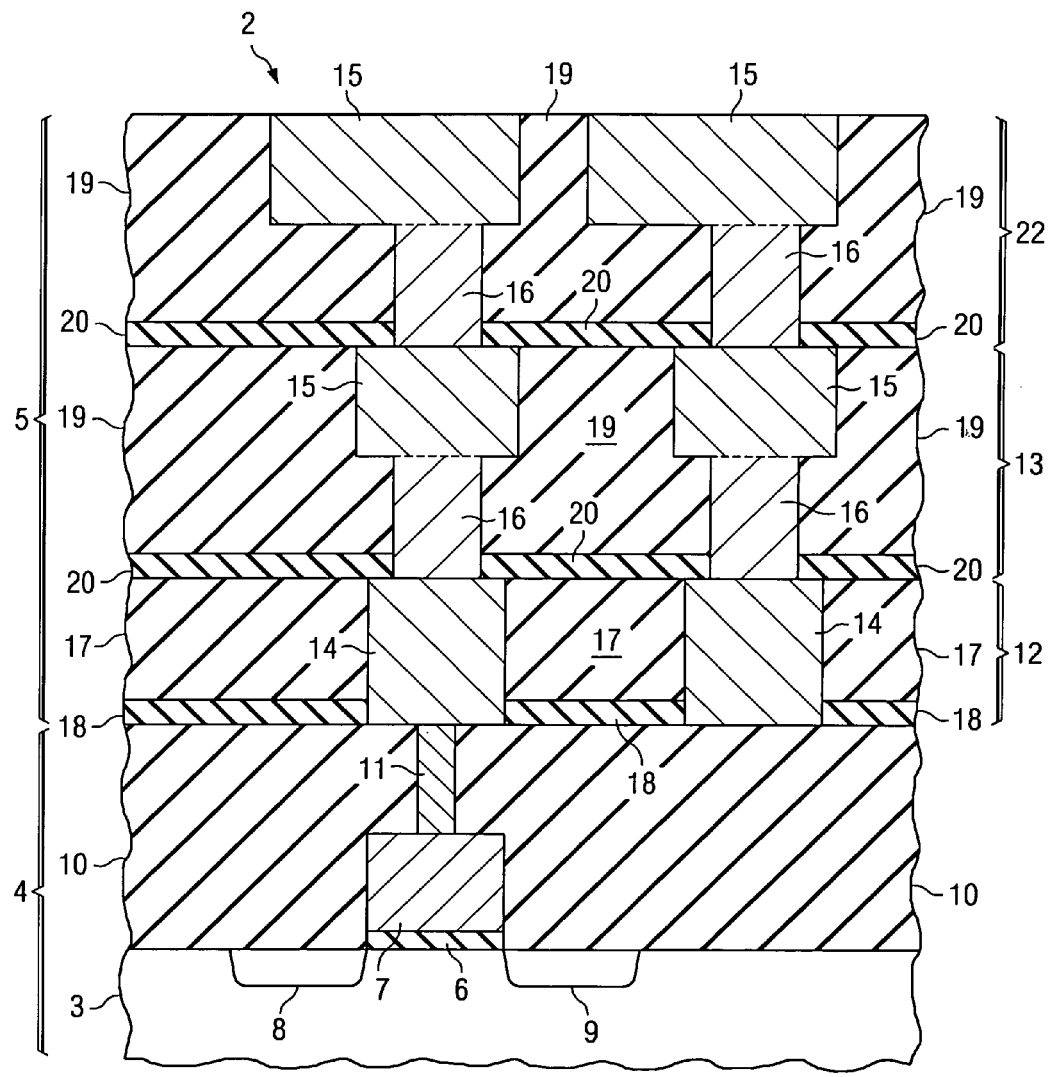
FIG. 1 is a cross-section view of a partial integrated circuit in accordance with a first embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-section view of a partial integrated circuit 2 in accordance with a first embodiment of the present invention. The integrated circuit fabrication or process flow is divided into two parts: the fabrication of the Front-End-Of-Line (FEOL) structure 4 and the fabrication of the Back-End-Of-Line (BEOL) structure 5. The structure that includes the silicon substrate 3 is called the FEOL structure 4 of the integrated circuit 2. In general, the FEOL 4 is the transistor layer formed on (and within) the semiconductor substrate 3. The partial FEOL 4 shown in FIG. 1 includes a transistor having a gate oxide 6, a gate electrode 7, and source/drain 8, 9; however, it is within the scope of the invention to have any form of logic within the FEOL structure 4.

Immediately above the transistor is a layer of dielectric insulation 10 containing metal contacts 11 that electrically tie the transistor to the other logic elements (not shown) of the FEOL structure 4. As an example, dielectric insulation 10 may be comprised of $SiO_2$ and contacts 11 may be comprised of W.

The BEOL 5 contains a single damascene layer 12 and at least one dual damascene layer 13, 22. Layers 12, 13 and 22 contain metal lines 14, 15 that properly route electrical signals and power properly through the electronic device. Layers 13 and 22 also contain vias 16 that properly connect the metal lines of one metal layer (e.g. the metal lines 14 of layer 12) to the metal lines of another metal layer (e.g. the metal lines 15 of layer 13).

The single damascene layer 12 has metal lines 14 electrically insulated by dielectric material 17. As an example, the metal lines 14 may contain any metal such as copper and the dielectric material 17 may be any insulative material such as fluorinated silica glass ("FSG") or organo-silicate glass ("OSG"). Furthermore, the single damascene layer 12 may have a thin dielectric layer 18 formed between the dielectric material 17 and the FEOL 4. It is within the scope of this invention to use any suitable material for the thin dielectric layer 18. For example, the thin dielectric layer 18 may comprise SiC, SiCN, SiCO, or $Si_3N_4$.

The thin dielectric layer 18 may perform many functions. For example, thin dielectric layer 18 may function as a diffusion barrier layer by preventing the copper from interconnects 14 from diffusing to the silicon channel of the transistor or to another isolated metal line (thereby creating an electrical short). Second, thin dielectric layer 18 may function as an etch-stop when manufacturing the metal lines 14 within the dielectric insulation material 17. Lastly, the thin dielectric layer 18 may function as an adhesion layer to help hold a layer of FSG 17 to the FEOL 4 or to the dual damascene layer 13. For purposes of readability, the thin dielectric layer 18 will be called the etch-stop layer 18 during the rest of the description of this invention.

Referring again to FIG. 1, dual damascene layers 13 and 22 contain metal lines 15 and vias 16 that are electrically insulated by dielectric material 19. The metal lines 15 may contain any metal such as copper. However, the use of other metals such as aluminum or titanium is within the scope of this invention. In accordance with one embodiment of the invention, the dielectric material 19 is a low-k material such as OSG. The dielectric material 19 may also be FSG, any low-k film, or any ultra low-k film. The dual damascene layers 13, 22 may also contain a dielectric layer 20 that serves as a via etch-stop layer during manufacturing. Any suitable dielectric material, such as SiC, SiCN, SiCO, or $Si_3N_4$ may be used as the via etch-stop layer 20.

Figure 2:
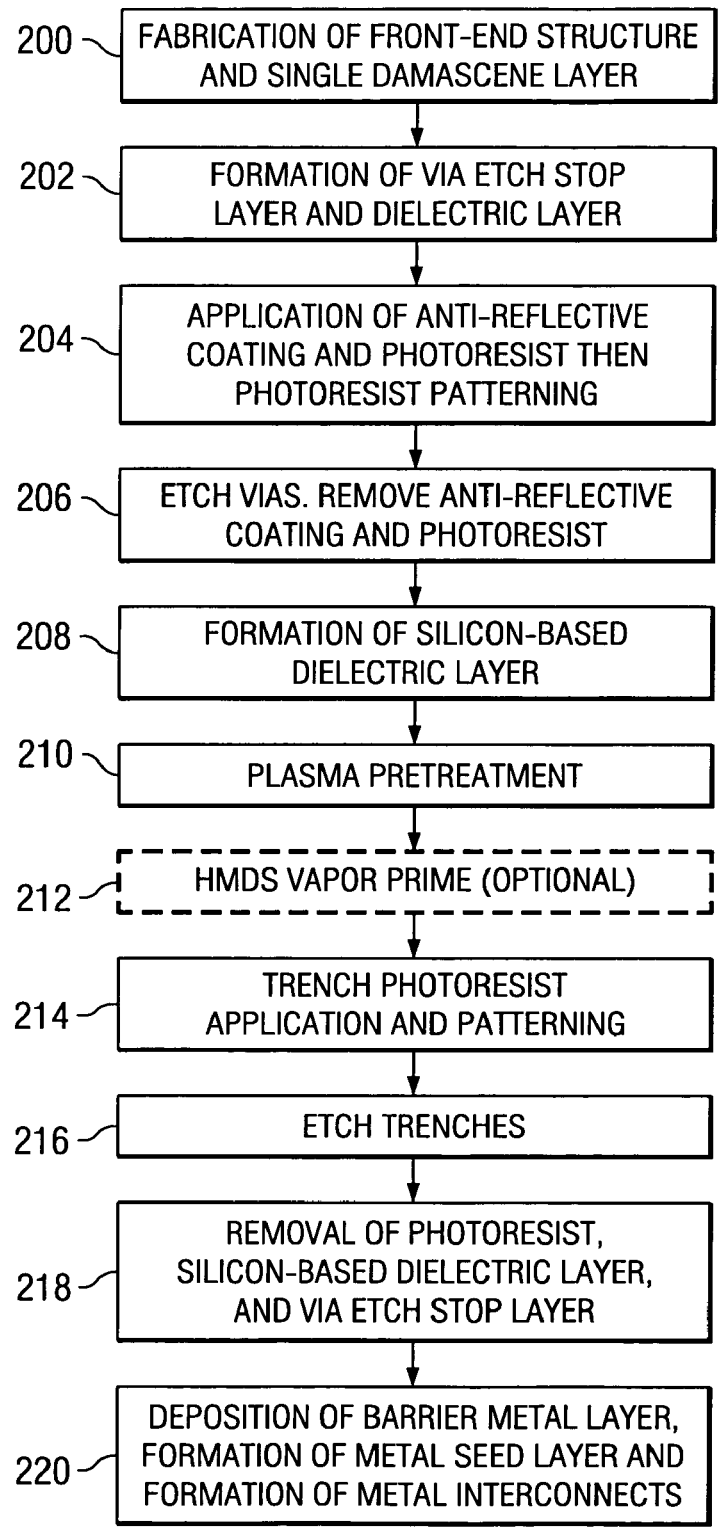
FIG. 2 is a flow chart illustrating the process flow of the present invention.

In accordance with the best mode of the present invention, a dual damascene layer—such as layer 13—is manufactured with a process that improves photoresist adhesion and reduces photoresist poisoning. FIG. 2 is a flow diagram illustrating the process flow of the invention. Other than process steps 208 and 210, the process steps for manufacturing the integrated circuit 2 are those standard in the industry.

The present invention may be used in any integrated circuit configuration; therefore the first step (step 200) is to fabricate the front-end structure 4 to create any logic elements necessary to perform the desired integrated circuit function. In addition, the single damascene layer 12 of the BEOL 5 is fabricated over the FEOL 4 using current manufacturing processes.

Referring now to FIGS. 3A-3G; a via etch-stop layer 20 is now formed (step 202 and FIG. 3A) over the entire substrate. The via etch-stop layer 20 may be formed using any manufacturing process such as Plasma-Enhanced Chemical Vapor Deposition ("PECVD"). In this example application, the via etch-stop layer 20 is comprised of SiC; however, other dielectric materials such as SiCN, SiCO, or $Si_3N_4$ may be used.

Next a low-k dielectric layer 19 is formed (step 202, FIG. 3A) over the entire substrate (i.e. over the via etch-stop layer 20). The low-k dielectric material may be applied to the substrate with a Chemical Vapor Deposition ("CVD") or a spin-on manufacturing process. In the example application, the dielectric layer 19 is an OSG film. However, any other low-k dielectric (e.g. k<3.0), or a combination or stack of low-k dielectric materials, may be used. For example, the dielectric layer may be the dielectric stack configuration shown in FIG. 4. The example dielectric layer of the dual damascene layer 13 shown in FIG. 4 is a stack comprised of the low-k dielectric 19, a dielectric trench etch-stop layer 23, and another dielectric layer 24. The trench etch-stop layer may be the same material as the via etch-stop 20 or a different dielectric material may be used. In addition, the dielectric layer 24 may be the same low-k material used for dielectric layer 19 or a different dielectric material may be used. Moreover, dielectric layer 19 and dielectric layer 24 may be a dielectric material other than low-k OSG (such as TEOS, FSG, or ultra low-k film (e.g. k<2.5)). This alternative dielectric configuration could be used in one or more dual damascene layers 13, 22.

Figure 3A:
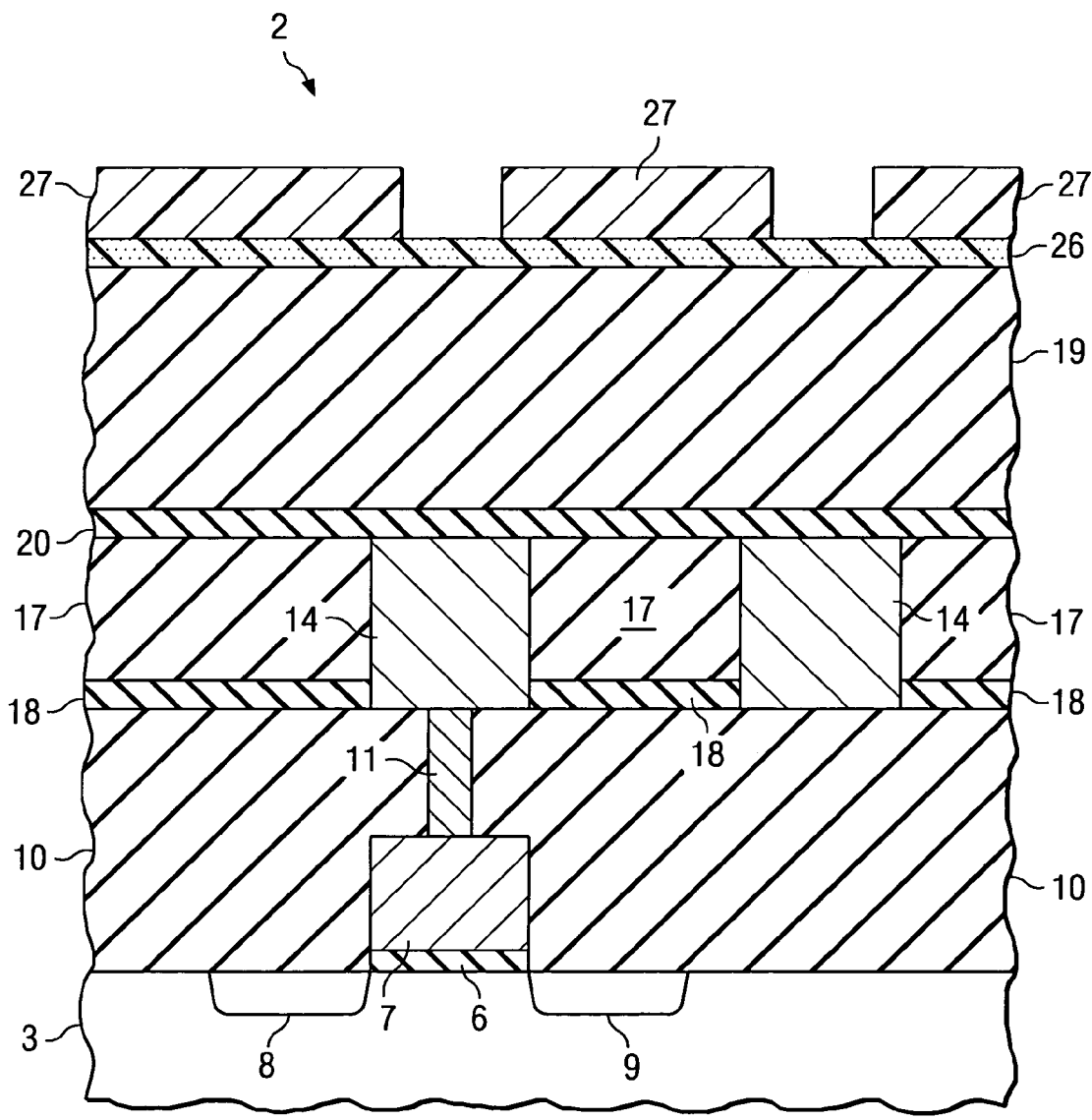
FIGS. 3A-3G are cross-sectional diagrams of a process for forming a dual damascene layer accordance with the present invention.
Figure 3B:
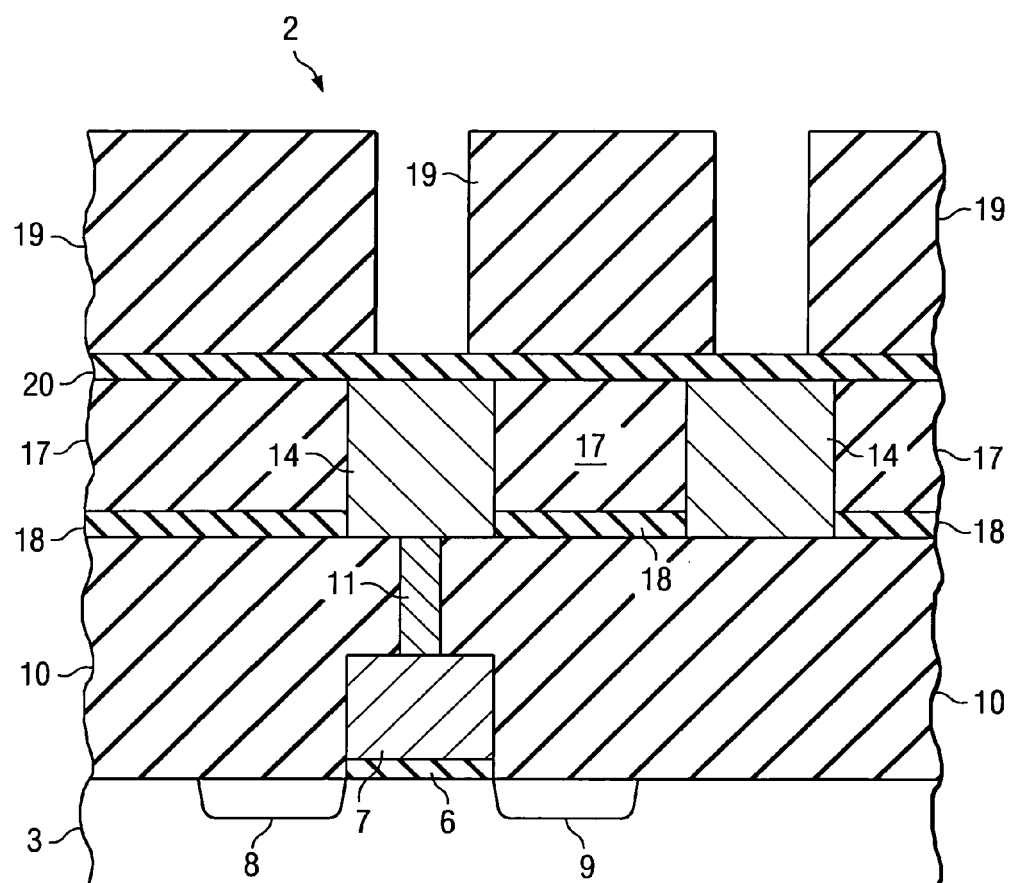
Figure 4:
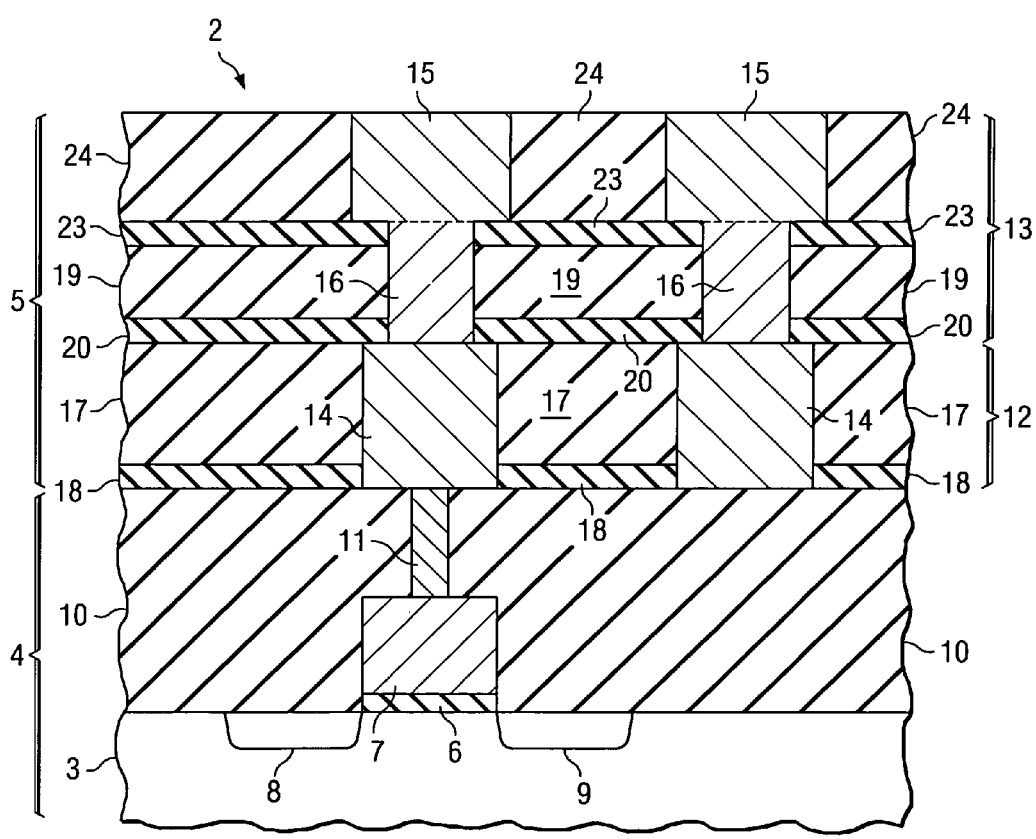
FIG. 4 is a cross-section view of a partial integrated circuit in accordance with a second embodiment of the present invention.

Referring again to FIG. 2, step 204 starts with forming a bottom anti-reflection coating ("BARC") over the dielectric layer 19, as shown in FIG. 3A. The BARC layer 26 is an organic material that may be applied with a spin-on process. Next, a layer of photoresist 27 is applied and then patterned by a lithography process. In this example application the hole for the via is formed first, therefore, this is called a "via first" dual damascene process. As shown in FIG. 3A a via pattern is created on the photoresist 27 once the photoresist is developed.

Now the holes for the vias are etched using any well-known manufacturing process such as fluorocarbon-based plasma etch (step 206). In this example process the via hole is etched through the BARC layer 26 and the dielectric layer 19. However, various via-first process flows are within the scope of this invention. For example, the dielectric layer 20 may also be etched at this time (rather than being etched in step 218). Or, a partial via etch through dielectric layer 19 may be performed (and then the via etch is completed in a later step such as step 216). Once the via holes have been etched, the BARC 26 and photoresist 27 is removed by an ash process and an optional wet clean (step 206), resulting in the structure shown in FIG. 3B.

In the via-first process, the next step is to create the pattern for the trenches. However, applying a second layer of BARC and photoresist and then developing the photoresist to create the trench pattern is problematic. First, resist and BARC thinning occurs in dense via regions during trench patterning due to via topology. The result is resist breakdown during trench etch. Therefore, to prevent trench bridging or metal shoring, it is necessary to fill and planarize the via features.

A second key issue for low-k dual damascene trench patterning is resist poisoning. After the via etch and clean (step 206) the dielectric layer 19 and the via etch-stop layer 20 inside the via holes is exposed (see FIG. 3B). During the subsequent trench patterning potential poisoning agents (such as N) can diffuse through the via etch-stop layer 20 and the low-k material 19. The poisoning agents then interact with the trench photoresist, precipitating the resist poisoning. As a result, the photoresist does not develop properly and extra (undeveloped) photoresist will remain on the substrate. As a result, the trench pattern will not match the reticle pattern used in the lithography step.

Figure 3C:
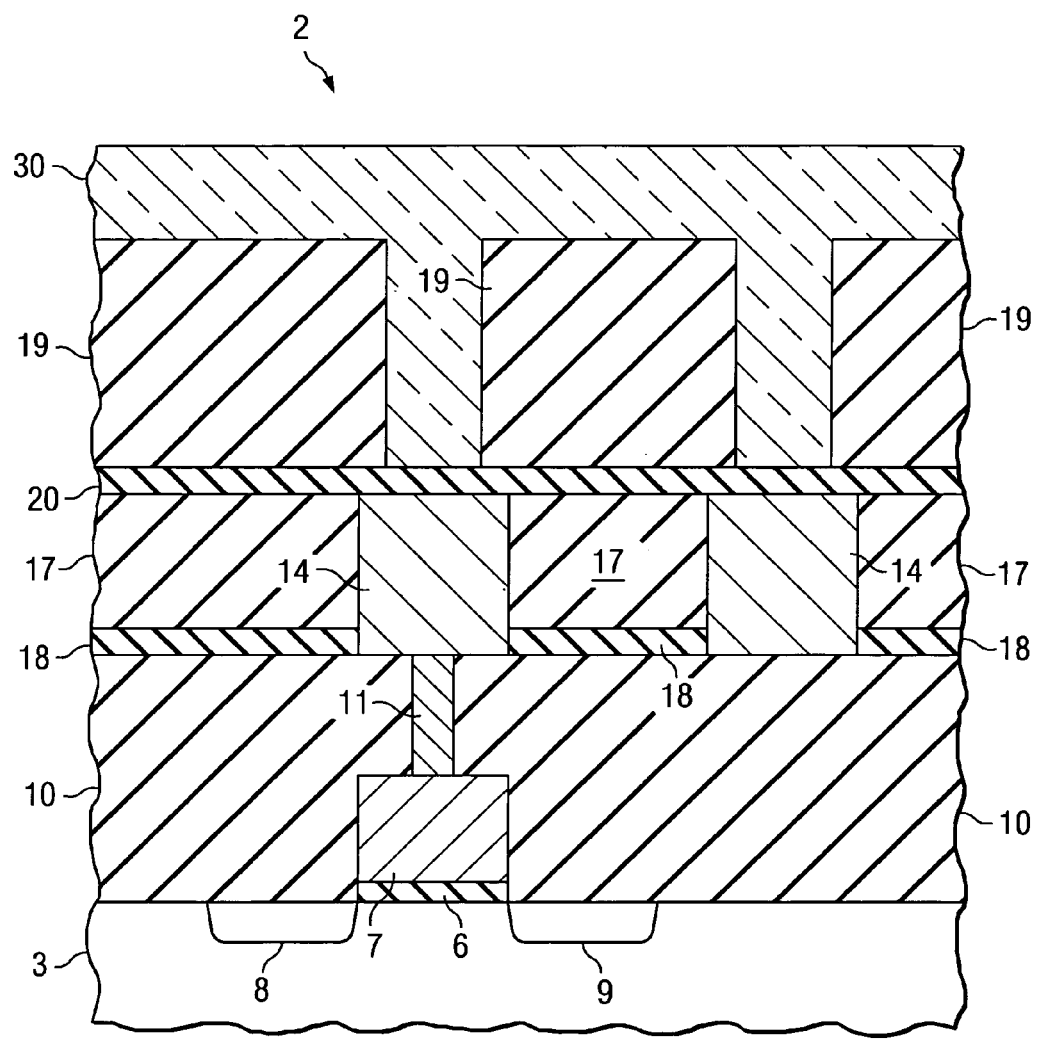

In accordance with the invention, a silicon-based dielectric layer 30 (step 208) is formed over the substrate as shown in FIG. 3C. The silicon-based dielectric layer 30 fills the via features, provides a planarized surface for optimal resist patterning, serves as an anti-reflective coating, and has high etch selectivity to resist. In the best mode application, the silicon-based dielectric layer 30 is an anti-reflective spin-on-glass ("SOG") material such as Duo193® (for a desired lithographic exposure wavelength of 193 nm) manufactured by Honeywell. However, the use of other materials is within the scope of this invention. For example, layer 30 may be Duo248® manufactured by Honeywell.

In accordance with the invention, the semiconductor wafer is subjected to a plasma pretreatment (step 210) before trench patterning. The plasma pretreatment reduces photoresist poisoning and improves the adhesion of the photoresist (used for trench patterning) to the Duo193® layer 30. In accordance with the best mode of the invention, the plasma pretreatment is performed in a TEL DRM etcher at a pressure of approximately 60 mT, a power of approximately 500 W, for approximately 60 seconds, with a chuck temperature of 40° C., using Ar gas with a flow rate of 500 sccm and $O_2$ gas with a flow rate of 20 sccm.

However, it is within the scope of the invention to perform the plasma pretreatment under any suitable operating conditions. For example, the pressure used for the plasma pretreatment (step 210) may be between 25 mT and 100 mT and the power used for pretreatment may be between 300 W and 800 W. In addition, the plasma pretreatment may be performed for longer than 15 seconds and the chuck temperature may vary between 25° C. and 80° C. Furthermore, flow rate of $O_2$ may vary between 10-200 sccm and the flow rate of Ar may vary between 0-1000 sccm. Moreover, any oxygen containing gas or gas mixture may be used for the plasma pretreatment such as $O_2$, $O_3$, $CO_2$, CO, $H_2O$, or $H_2O_2$— with or without gas additives such as Ar or He.

Figure 3D:
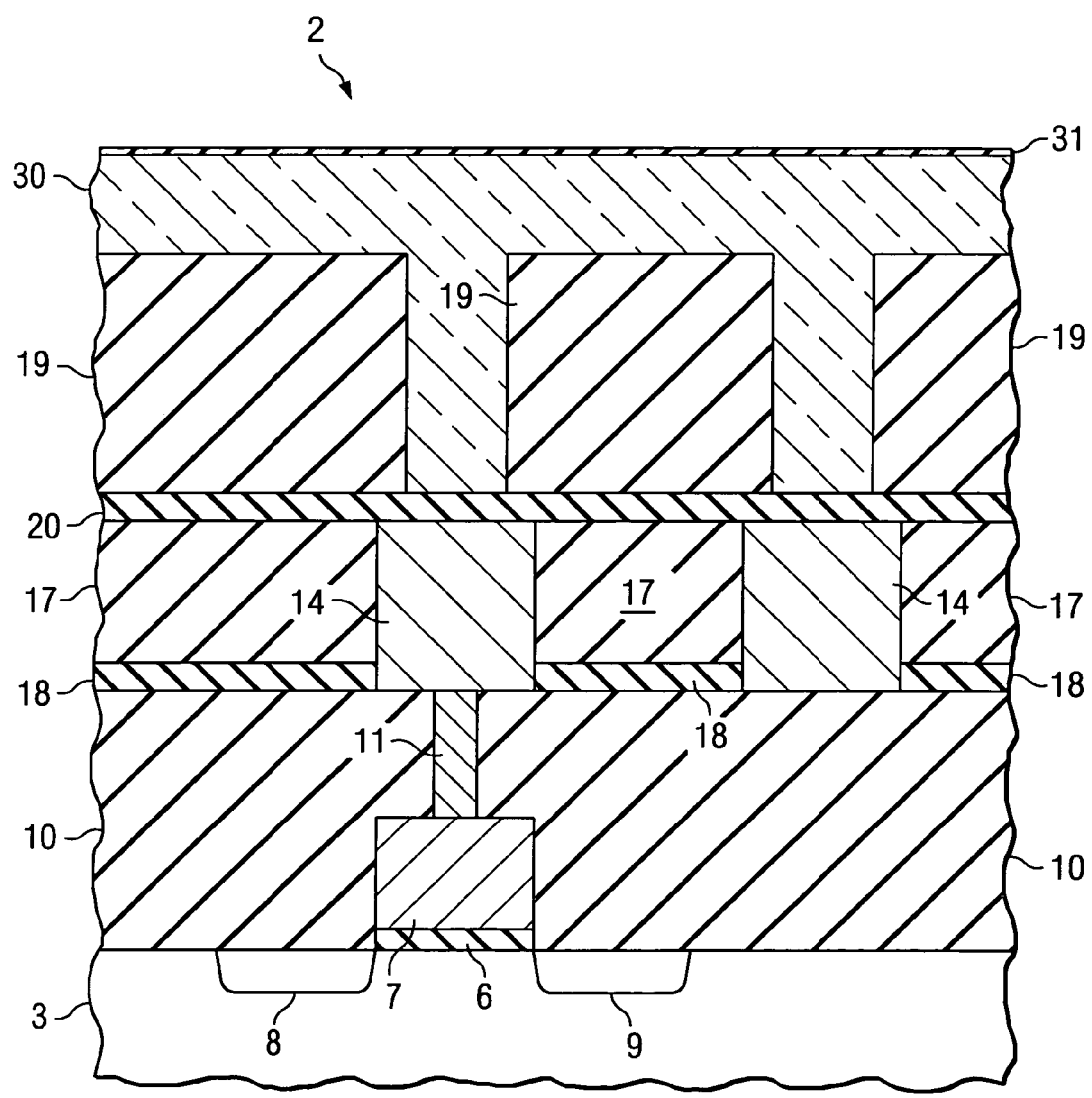

Although a TEL DRM etcher is used for the plasma pretreatment step 210 in the example application, any suitable reactive ion etching ("RIE") tool may be used. As shown in FIG. 3D, the plasma pretreatment modifies the surface of the Duo193® layer 30 and forms a thin layer of $SiO_2$-like film 31 over the Duo193® surface (this can be seen with X-ray Photoelectron Spectroscopy analysis).

The optional step 212 is to apply a vapor prime to the semiconductor wafer surface. In the example application, a Hexamethyldisilazane ("HMDS") vapor prime is applied on the wafer using a TEL coater.

Figure 3E:
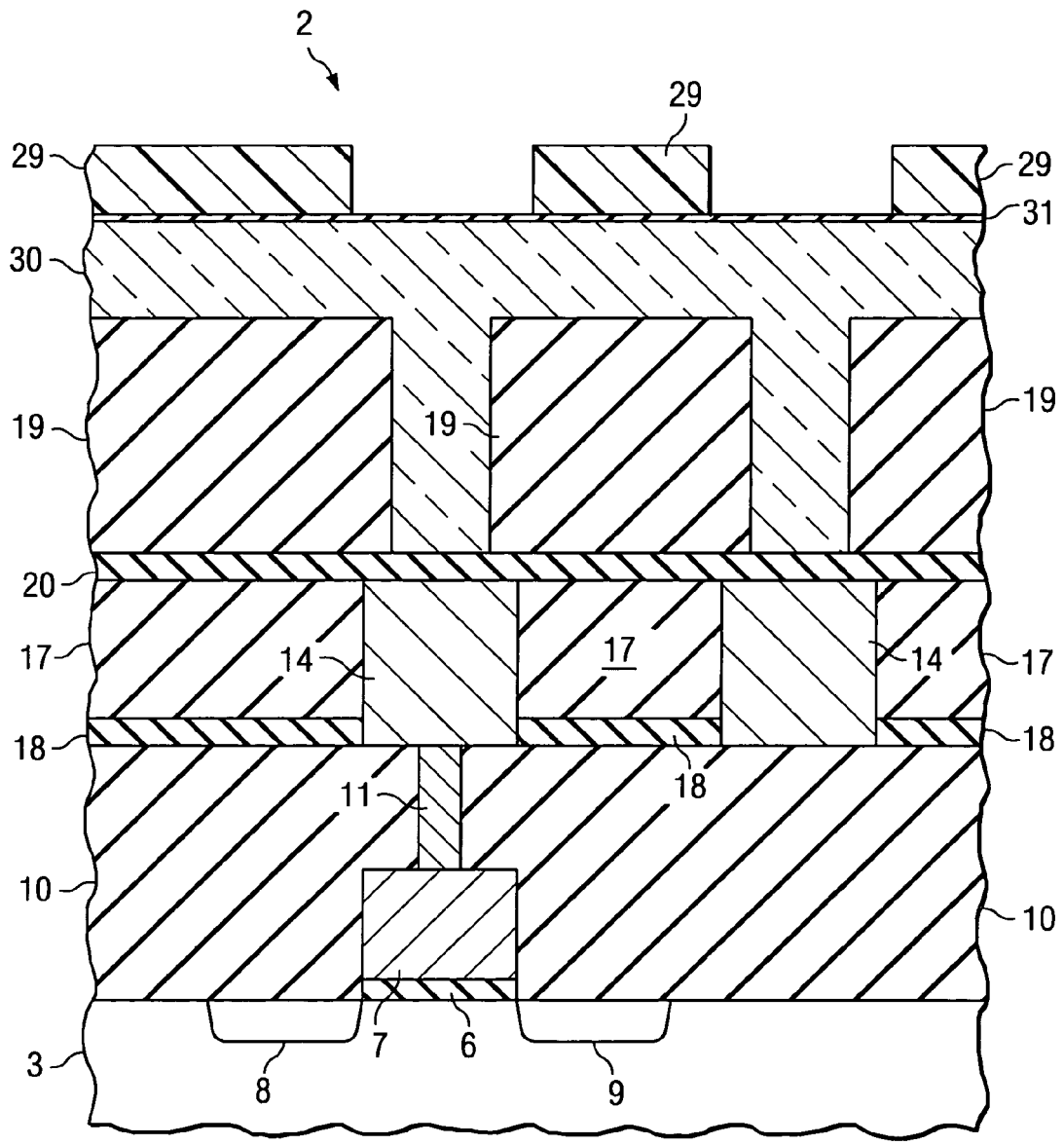

Next, in step 214, a layer of photoresist 29 is again applied, exposed, and developed to create the trench pattern. It is to be noted that the trench resist 29 is likely to be different than the via resist 27. The semiconductor wafer at this point in the manufacturing process is shown in FIG. 3E.

Figure 3F:
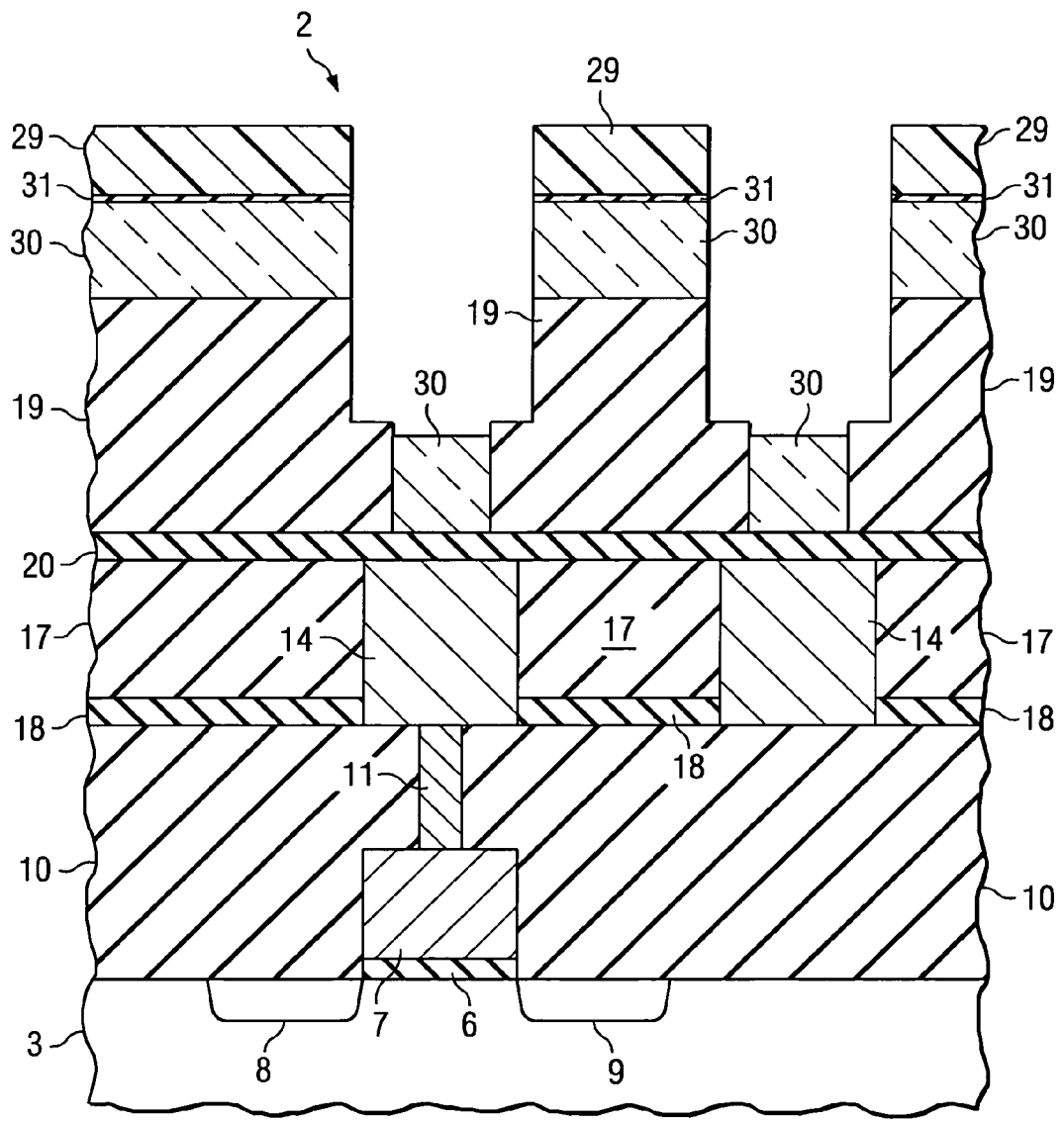

The trenches are etched (step 216) using any well-known manufacturing process such as an anisotropic etch in a RIE tool. If a trench etch-stop layer 23 was formed within the dielectric layer 19 (as shown in FIG. 4) then the trench etch-stop 23 is used to create the proper trench depth. Otherwise, the trench depth is controlled through a timed etch using manufacturing process control techniques. Once the trenches have been etched there will be Duo193® material remaining in the vias (having a height that is slightly less than the height of the via) as shown in FIG. 3F.

Figure 3G:
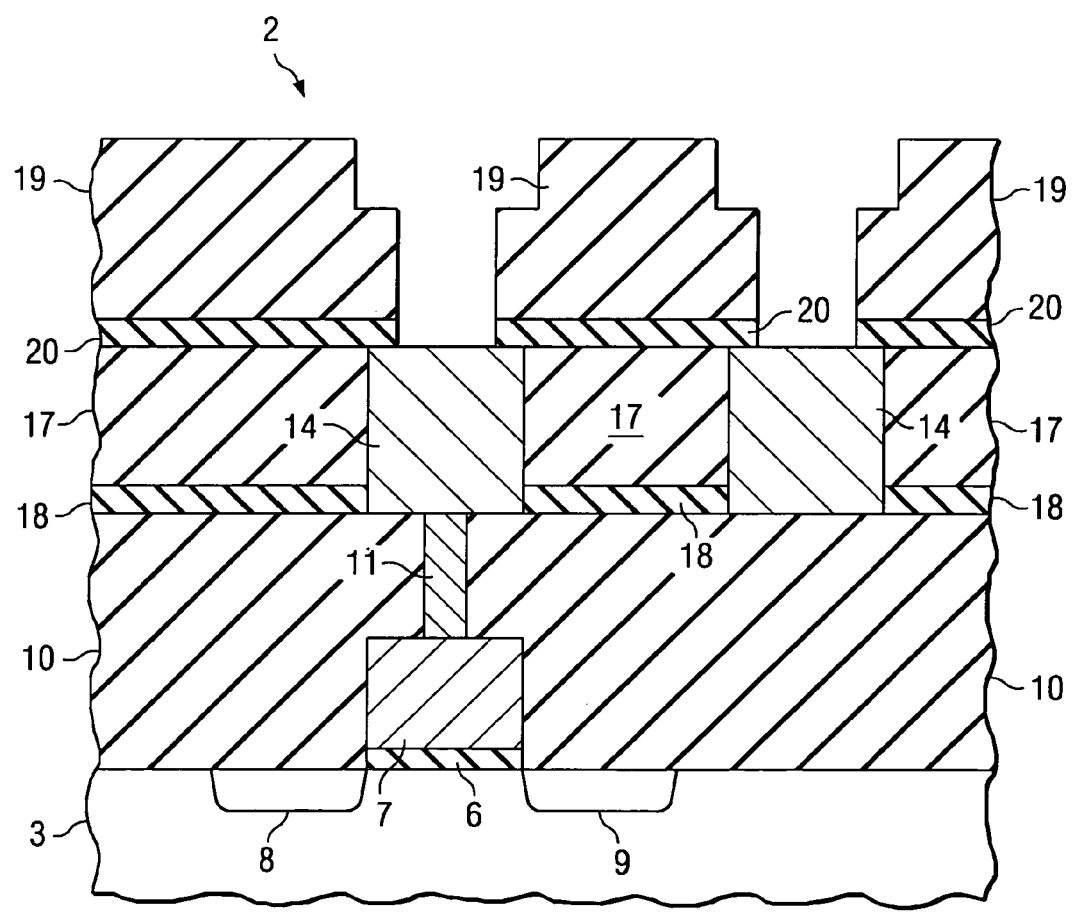

Next, in step 218 a standard ash process is used to remove the photoresist 29. Also in step 218, the Duo193® material 30 (and with it the layer 31) is removed with etch chemistries having high selectivity to the low-k dielectric layer 19 and the via etch-stop layer 20. Lastly, the via etch-stop layer 20 located under the Duo193® material 30 is removed using standard RIE processes to expose the underlying copper layer (i.e. metal lines 14). It is to be noted that the thickness of the dielectric layer 19 is reduced during the etch of the via etch-stop layer 20. The structure of the integrated circuit 2 after step 218 is shown in FIG. 3G.

Now the fabrication of the dual damascene layer 13 continues using standard manufacturing techniques. In the example application the next phase of the manufacturing process (step 220) includes the deposition of a thin barrier film, the formation of a metal seed layer, and then the formation of the metal interconnects. The barrier film may be comprised of any suitable material such as TaN and may be deposited by a PVD process. The metal seed layer may be any suitable material such as copper and may be deposited by a PVD process. The metal interconnects may be any suitable material such as copper and may be formed by first applying a metal layer over the semiconductor substrate through a standard technique such as electro-chemical deposition ("ECD"). The metal layer is then polished until the top surface of the dielectric 19 is exposed and the metal trenches 15 and metal vias 16 are formed (see FIG. 1). The polish step is performed with a Chemical Mechanical Polish ("CMP") process; however, other manufacturing techniques may be used. At this point, any remaining dual damascene layers (such as layer 22 shown in FIG. 1) of the back-end structure 5 are fabricated using either standard manufacturing techniques or the techniques of the present invention.

Figure 5A:
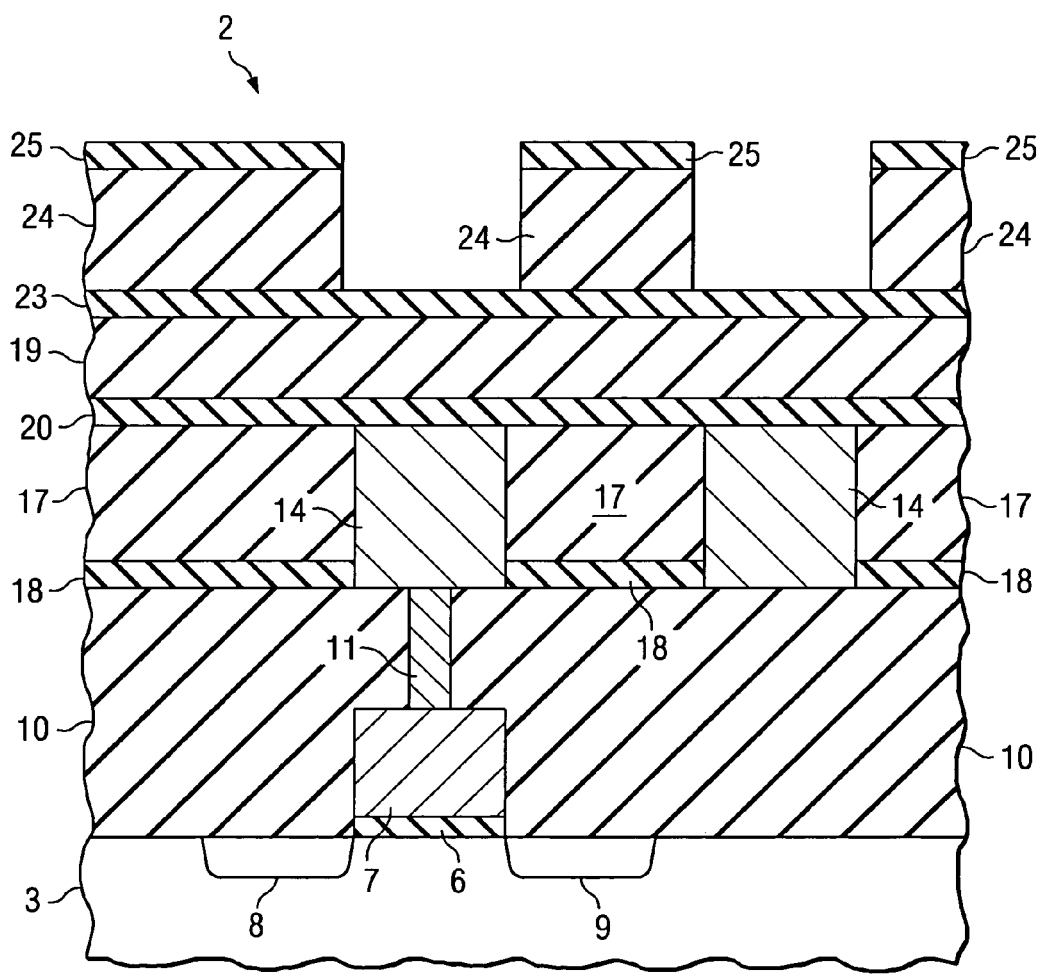
FIGS. 5A-5B are cross-sectional diagrams of a process for forming a dual damascene layer in accordance with a third embodiment of the present invention.

If a trench-first manufacturing process is used, then the trenches are patterned in step 204 and the trenches are etched in step 206. The structure of the integrated circuit 2 at this stage in the manufacturing process is shown in FIG. 5A. A trench etch-stop layer 23 (preferably comprised of $Si_3N_4$, SiC, SiCO, or SiCN) is shown in this application for illustrative purposes. If present, the trench etch-stop layer 23 controls the depth of the trench etch process (step 206).

Figure 5B:
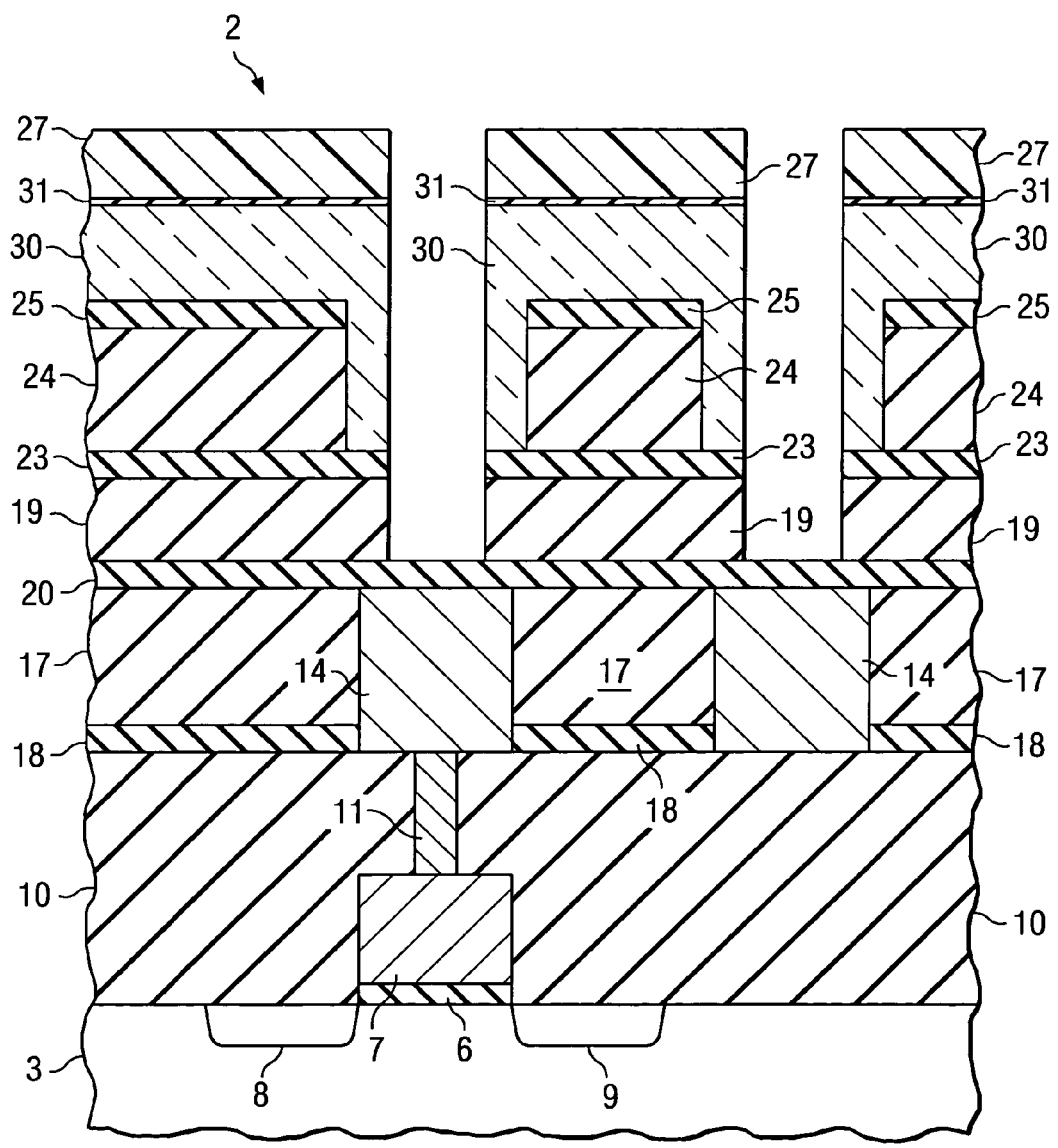

In the trench-first manufacturing process the vias now are patterned and etched. Like the via-first manufacturing process described previously, a silicon-based dielectric layer is formed (step 208), a plasma pretreatment is performed (step 210), an optional vapor prime is applied (step 212), photoresist is applied and patterned (step 214), and then the vias are etched. The structure at this point in the manufacturing process is shown in FIG. 5B. After the removal of the photoresist, the silicon-based dielectric layer, and the via etch-stop layer (step 218) and then the metallization of the trenches and vias (step 220), the structure will be similar to the structure shown in FIG. 4. Like the via-first manufacturing process, the use of a plasma pretreatment (step 210) in the trench-first process guards against photoresist poisoning and improves photoresist adhesion during the patterning of the vias.

Various modifications to the invention as described above are within the scope of the claimed invention. As an example, the inventive process described above may be used in any location of the FEOL 4 or BEOL 5 where an implant or etch step using a resist pattern over a silicon-based dielectric is desired. Furthermore, instead of Duo193® or Duo248®, the use of any suitable spin-on-glass material or silicon-based dielectric materials such as $Si_3N_4$ or SiON is within the scope of the invention.

Instead of using positive photoresist as described above, negative photoresist may be used. Furthermore, a cap layer may be formed over the dielectric layer 19 to serve as a hard mask during the etch of the vias and trenches or serve as a stop layer for CMP process. In addition, it is within the scope of the invention to have a back-end structure 5 with a different amount or configuration of metal layers 12, 13 than is shown in FIGS. 1 and 4.

The semiconductor substrate in the example application includes a semiconductor crystal, typically silicon. However, other semiconductors such as GaAs and InP may be used. In addition to a semiconductor crystal, the substrate 3 may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Moreover, the invention is applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing an integrated circuit comprising:
depositing silicon-based spin-on anti-reflective dielectric material over a semiconductor substrate;
pretreating a top surface of said silicon-based spin-on anti-reflective dielectric material;
forming a photoresist layer over said pretreated silicon-based spin-on anti-reflective dielectric material;
patterning said photoresist layer; and
etching said integrated circuit wherein said step of pretreating a top surface of said silicon-based spin-on anti-reflective dielectric material is performed with a plasma having a process gas containing oxygen.

2. The method of claim 1 wherein said plasma pretreatment is performed at a pressure of approximately 60 mT, a power of approximately 500 W, for approximately 60 seconds, with a chuck temperature of 40° C., using said $O_2$ as said process gas with a flow rate of 20 sccm and Ar gas with a flow rate of 500 sccm.

3. The method of claim 1 wherein said plasma pretreatment is performed at a pressure between 25 mT and 100 mT, a power between 300 W and 800 W, for longer than 15 seconds, at a chuck temperature between 25° C. and 80° C., an $O_2$ flow rate between 10-200 sccm, and an Ar flow rate between 0-1000 sccm.

4. The method of claim 1 further comprising the step of applying a varpor prime to said integrated circuit after said pretreating step.

5. The method of claim 1 wherein said silicon-based spin-on anti-reflective dielectric material is Duo193® manufactured by Honeywell.

6. The method of claim 1 wherein said silicon-based spin-on anti-reflective dielectric material is Duo248® manufactured by Honeywell.

7. A method of manufacturing a dual damascene back-end layer of an integrated circuit comprising:
forming a via etch-stop layer over a semiconductor substrate;

forming a dielectric layer over said via etch-stop layer;
forming an anti-reflective layer over said dielectric layer;
forming a photoresist layer over said anti-reflective layer;
patterning said photoresist layer;
etching via holes;
removing said photoresist layer and said anti-reflective layer;
depositing spin-on-glass material over said dielectric layer and within said via holes;
pretreating a top surface of said spin-on glass material;
applying a vapor prime to said integrated circuit;
forming a photoresist layer over said spin-on-glass material;
patterning said photoresist layer; and
etching trench spaces;
removing said photoresist layer;
removing said spin-on-glass material;
removing said via etch-stop layer located at the bottom of said via holes;
depositing a barrier film over said semiconductor substrate;
forming a metal seed layer; and
forming metal interconnects.

8. The method of claim 7 wherein said step of pretreating a top surface of said spin-on glass material is performed with a plasma having a process gas containing $O_2$.

9. The method of claim 8 wherein said plasma pretreatment is performed at a pressure of approximately 60 mT, a power of approximately 500 W, for approximately 60 seconds, with a chuck temperature of 40° C., using $O_2$ process gas with a flow rate of 20 sccm and Ar gas with a flow rate of 500 sccm.

10. The method of claim 8 wherein said plasma pretreatment is performed at a pressure between 25 mT and 100 mT, at a power between 300 W and 800 W, for longer than 15 seconds, at a chuck temperature between 25° C. and 80° C., an $O_2$ flow rate between 10-200 sccm and an Ar flow rate between 0-1000 sccm.

11. The method of claim 7 wherein said vapor prime is HMDS vapor prime.

12. The method of claim 7 wherein said spin-on-glass material is Duo193® manufactured by Honeywell.

13. The method of claim 7 wherein said spin-on-glass material is Duo248® manufactured by Honeywell.

14. The method of claim 7 wherein said dielectric layer comprises an Inter-Level Dielectric layer and an Inter-Metal Dielectric layer.

15. The method of claim 7 wherein said dielectric layer comprises an Inter-Level Dielectric layer, a trench etch-stop layer, and an Inter-Metal Dielectric layer.

16. The method of claim 7 wherein said dielectric layer comprises a low-k dielectric material.

17. The method of claim 7 wherein said dielectric layer comprises an ultra low-k dielectric material.

18. The method of claim 7 wherein said metal seed layer contains copper.

19. The method of claim 7 wherein said metal interconnects contain copper.

20. A method of manufacturing an integrated circuit comprising:
forming a front-end structure over a semiconductor substrate;
forming a single damascene back-end layer over said front-end structure;
forming a via etch-stop layer over said single damascene back-end layer;
forming a dielectric layer over said via etch-stop layer;
forming a anti-reflective layer over said dielectric layer;
forming a photoresist layer over said anti-reflective layer;
patterning said photoresist layer;
etching via holes;
removing said photoresist layer and said anti-reflective layer;
depositing anti-reflective spin-on-glass material over said dielectric layer and within said via holes;
performing a plasma pretreatment to said integrated circuit, said plasma pretreatment having a process gas containing $O_2$;
applying a vapor prime to said integrated circuit;
forming a photoresist layer over said anti-reflective spin-on-glass material;
patterning said photoresist layer; and
etching trench spaces.

21. The method of claim 20 wherein said plasma pretreatment is performed at a pressure of approximately 60 mT, a power of approximately 500 W, for approximately 60 seconds, with a chuck temperature of 40 C., using said $O_2$ process gas with a flow rate of 20 sccm and Ar gas with a flow rate of 500 sccm.

22. The method of claim 20 wherein said plasma pretreatment is performed at a pressure between 25 mT and 100 mT, a power between 300 W and 800 W, for longer than 15 seconds, at a chuck temperature between 25° C. and 80° C., an $O_2$ flow rate between 10-200 sccm, and an Ar flow rate between 0-1000 sccm.

23. The method of claim 20 wherein said vapor prime is HMDS vapor prime.

24. The method of claim 20 wherein said anti-reflective spin-on-glass material is Duo193® manufactured by Honeywell.

25. The method of claim 20 wherein said anti-reflective spin-on-glass material is Duo248® manufactured by Honeywell.

26. The method of claim 20 wherein said dielectric layer comprises an Inter-Level Dielectric layer and an Inter-Metal Dielectric layer.

27. The method of claim 20 wherein said dielectric layer comprises an Inter-Level Dielectric layer, a trench etch-stop layer, and an Inter-Metal Dielectric layer.

28. The method of claim 20 wherein said dielectric layer comprises a low-k dielectric material.

29. The method of claim 20 wherein said dielectric layer comprises an ultra low-k dielectric material.

30. The method of claim 20 wherein said step of etching via holes includes etching partial via holes and said step of etching trench spaces includes etching a remainder of said via holes.

31. The method of claim 20 further comprising forming a cap layer on top of said dielectric layer.

32. The method of claim 20 wherein said step of performing a plasma pretreatment to said semiconductor wafer modifies a top surface of said anti-reflective spin-on glass material, forming a thin $SiO_2$ layer.

33. The method of claim 20 further comprising:
removing said photoresist layer;
removing said anti-reflective spin-on-glass material;
removing said via etch-stop layer located at the bottom of said via holes;
depositing a barrier film over said semiconductor substrate;
forming a metal seed layer; and
forming metal interconnects.

34. The method of claim 33 wherein said metal seed layer contains copper.

35. The method of claim 33 wherein said metal interconnects contain copper.

36. The method of claim 33 further comprising forming at least one additional dual damascene back-end layer over said semiconductor substrate.

37. A method of manufacturing an integrated circuit comprising:
forming a front-end structure over a semiconductor substrate;
forming a single damascene back-end layer over said front-end structure;
forming a via etch-stop layer over said single damascene back-end layer;
forming a dielectric layer over said via etch-stop layer;
forming a anti-reflective layer over said dielectric layer;
forming a photoresist layer over said anti-reflective layer;
patterning said photoresist layer;
etching trench spaces;
removing said photoresist layer and said anti-reflective layer;
depositing anti-reflective spin-on-glass material over said dielectric layer and within said trench spaces;
performing a plasma pretreatment to said integrated circuit, said plasma pretreatment having a process gas containing $O_2$;
applying a vapor prime to said integrated circuit;
forming a photoresist layer over said anti-reflective spin-on-glass material;
patterning said photoresist layer; and
etching via holes.

38. The method of claim 37 wherein said plasma pretreatment is performed at a pressure of approximately 60 mT, a power of approximately 500 W, for approximately 60 seconds, with a chuck temperature of 40° C., using said $O_2$ process gas with a flow rate of 20 sccm and Ar gas with a flow rate of 500 sccm.

39. The method of claim 37 wherein said plasma pretreatment is performed at a pressure between 25 mT and 100 mT, a power between 300 W and 800 W, for longer than 15 seconds, at a chuck temperature between 25° C. and 80° C., an $O_2$ flow rate between 10-200 sccm, and an Ar flow rate between 0-1000 sccm.

40. The method of claim 37 wherein said vapor prime is HMDS vapor prime.

41. The method of claim 37 wherein said anti-reflective spin-on-glass material is Duo193® manufactured by Honeywell.

42. The method of claim 37 wherein said anti-reflective spin-on-glass material is Duo248® manufactured by Honeywell.

43. The method of claim 37 wherein said dielectric layer comprises an Inter-Level Dielectric layer and an Inter-Metal Dielectric layer.

44. The method of claim 37 wherein said dielectric layer comprises an Inter-Level Dielectric layer, a trench etch-stop layer, and an Inter-Metal Dielectric layer.

45. The method of claim 37 wherein said dielectric layer comprises a low-k dielectric material.

46. The method of claim 37 wherein said dielectric layer comprises an ultra low-k dielectric material.

47. The method of claim 37 further comprising forming a cap layer on top of said dielectric layer.

48. The method of claim 37 wherein said step of performing a plasma pretreatment to said semiconductor wafer modifies a top surface of said anti-reflective spin-on glass material, forming a thin $SiO_2$ layer.

49. The method of claim 37 further comprising:
removing said photoresist layer;
removing said anti-reflective spin-on-glass material;
removing said via etch-stop layer located at the bottom of said via holes;
depositing a barrier film over said semiconductor substrate;
forming a metal seed layer; and
forming metal interconnects.

50. The method of claim 49 wherein said metal seed layer contains copper.

51. The method of claim 49 wherein said metal interconnects contain copper.

52. The method of claim 49 further comprising forming at least one additional dual damascene back-end layer over said semiconductor substrate.

* * * * *